(12) United States Patent
Yosui et al.

(10) Patent No.: US 10,741,462 B2
(45) Date of Patent: Aug. 11, 2020

(54) RESIN SUBSTRATE, COMPONENT-MOUNTING RESIN SUBSTRATE, AND METHOD OF MANUFACTURING COMPONENT-MOUNTING RESIN SUBSTRATE

(71) Applicant: Murata Manufacturing Co., Ltd., Nagaokakyo-shi, Kyoto-fu (JP)

(72) Inventors: Kuniaki Yosui, Nagaokakyo (JP); Hirofumi Shinagawa, Nagaokakyo (JP); Yuki Ito, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/904,469

(22) Filed: Feb. 26, 2018

(65) Prior Publication Data

US 2018/0182681 A1    Jun. 28, 2018

Related U.S. Application Data

(63) Continuation of application No. PCT/JP2016/075264, filed on Aug. 30, 2016.

(30) Foreign Application Priority Data

Sep. 1, 2015 (JP) .................................. 2015-171819

(51) Int. Cl.
*H01L 23/12* (2006.01)
*H01L 23/498* (2006.01)
(Continued)

(52) U.S. Cl.
CPC .............. *H01L 23/12* (2013.01); *H01L 23/48* (2013.01); *H01L 23/4985* (2013.01);
(Continued)

(58) Field of Classification Search
CPC ......... H01L 23/12; H01L 23/48; H01L 23/13; H01L 23/4985; H01L 23/49816;
(Continued)

(56) References Cited

U.S. PATENT DOCUMENTS 8,390,106 B2 * 3/2013 Maeda ................ H01L 23/3128
257/678
9,401,532 B2 * 7/2016 Tago .................... H05K 1/0225
(Continued)

FOREIGN PATENT DOCUMENTS

JP    05-152692 A    6/1993
JP    07-283500 A   10/1995
(Continued)

OTHER PUBLICATIONS

Official Communication issued in corresponding Japanese Patent Application No. 2017-538031, dated Jul. 10, 2018.
(Continued)

*Primary Examiner* — Andrew Q Tran
(74) *Attorney, Agent, or Firm* — Keating & Bennett, LLP

(57) ABSTRACT

A component-mounting resin substrate includes a resin substrate and a component. The resin substrate includes a thermoplastic resin body. The component is mounted on the resin substrate by ultrasonic bonding. In a mounting area of the resin body in which the component is mounted, a cavity that is hollowed from a mounting surface on which the component is mounted is defined. A plating layer that includes a material harder than the resin body is disposed on at least a portion of a wall surface of the cavity.

15 Claims, 10 Drawing Sheets

(51) Int. Cl.
*H01L 23/00* (2006.01)
*H01L 23/48* (2006.01)
*H05K 3/32* (2006.01)
*H05K 1/02* (2006.01)
*H01L 23/13* (2006.01)
*H05K 1/03* (2006.01)
*H05K 3/46* (2006.01)

(52) U.S. Cl.
CPC .............. *H01L 24/81* (2013.01); *H05K 1/02* (2013.01); *H05K 3/32* (2013.01); *H05K 3/328* (2013.01); *H01L 23/13* (2013.01); *H01L 23/49816* (2013.01); *H01L 24/13* (2013.01); *H01L 24/16* (2013.01); *H01L 2224/1329* (2013.01); *H01L 2224/13101* (2013.01); *H01L 2224/16225* (2013.01); *H01L 2224/8185* (2013.01); *H01L 2224/81203* (2013.01); *H01L 2224/81207* (2013.01); *H01L 2224/81801* (2013.01); *H01L 2924/15151* (2013.01); *H01L 2924/15159* (2013.01); *H05K 1/0271* (2013.01); *H05K 1/0274* (2013.01); *H05K 1/0326* (2013.01); *H05K 3/4697* (2013.01); *H05K 2201/0129* (2013.01); *H05K 2201/0141* (2013.01); *H05K 2201/0949* (2013.01); *H05K 2201/09063* (2013.01); *H05K 2201/09072* (2013.01); *H05K 2201/09781* (2013.01); *H05K 2201/09845* (2013.01); *H05K 2201/10121* (2013.01); *H05K 2201/10553* (2013.01); *H05K 2201/2009* (2013.01)

(58) Field of Classification Search
CPC ......... H01L 24/81; H01L 24/16; H01L 24/13; H05K 1/02; H05K 1/0271; H05K 1/0274; H05K 3/32; H05K 3/328; H05K 3/4697
See application file for complete search history.

(56) References Cited

U.S. PATENT DOCUMENTS

| | | | |
|---|---|---|---|
| 9,692,100 B2 * | 6/2017 | Baba | ................... H05K 1/025 |
| 2004/0178486 A1 | 9/2004 | Maeda | |
| 2004/0212087 A1 | 10/2004 | Murayama et al. | |
| 2014/0176264 A1 | 6/2014 | Tago et al. | |

FOREIGN PATENT DOCUMENTS

| | | | | |
|---|---|---|---|---|
| JP | 11-340375 A | | 12/1999 | |
| JP | 2000-068328 A | * | 3/2000 | ... H01L 2224/16238 |
| JP | 2000-068328 A | | 3/2000 | |
| JP | 2000-208910 A | * | 7/2000 | ......... H01L 2224/16 |
| JP | 2000-332057 A | | 11/2000 | |
| JP | 2000-332057 A | * | 11/2000 | ... H01L 2224/16225 |
| JP | 2003-303849 A | * | 10/2003 | ........... H01L 24/742 |
| JP | 2003-303849 A | | 10/2003 | |
| JP | 2004-273777 A | | 9/2004 | |
| JP | 2004-327721 A | | 11/2004 | |
| JP | 2006-114664 A | | 4/2006 | |
| JP | 2006-120683 A | * | 5/2006 | ......... H01L 2224/16 |
| JP | 3909772 B2 | | 4/2007 | |
| JP | 2007-318080 A | | 12/2007 | |
| JP | 2012-079783 A | | 4/2012 | |
| WO | 2013/069763 A1 | | 5/2013 | |

OTHER PUBLICATIONS

Official Communication issued in International Patent Application No. PCT/JP2016/075264, dated Nov. 15, 2016.
Official Communication issued in corresponding Japanese Patent Application No. 2018-238995, dated Oct. 23, 2019.
Official Communication issued in corresponding Japanese Patent Application No. 2018-238995, dated Jun. 2, 2020.
English translation of Official Communication issued in corresponding Japanese Patent Application No. 2018-238995, dated Jun. 2, 2020.

* cited by examiner

RESIN SUBSTRATE, COMPONENT-MOUNTING RESIN SUBSTRATE, AND METHOD OF MANUFACTURING COMPONENT-MOUNTING RESIN SUBSTRATE

CROSS REFERENCE TO RELATED APPLICATIONS

This application claims the benefit of priority to Japanese Patent Application No. 2015-171819 filed on Sep. 1, 2015 and is a Continuation Application of PCT Application No. PCT/JP2016/075264 filed on Aug. 30, 2016. The entire contents of each application are hereby incorporated herein by reference.

BACKGROUND OF THE INVENTION

1. Field of the Invention

The present invention relates to a resin substrate that includes a front surface on which a component is mounted and that includes a flexible material.

2. Description of the Related Art

Component-mounting resin substrates have been used for various electronic devices. A component-mounting resin substrate includes a resin substrate and an electronic component. The electronic component is mounted on the resin substrate.

As disclosed in, for example, Japanese Patent No. 3909772, a semiconductor bare chip is mounted on a front surface of a thermoplastic flexible substrate. The semiconductor bare chip is bonded to the flexible substrate by ultrasonic bonding.

It is difficult to perform a bonding method in which the whole structure is heated, such as reflow soldering, on the thermoplastic flexible substrate. The reason is that the bonding method in which the whole structure is heated carries a risk that the flexible substrate is deformed by being softened or melted. In the case of using ultrasonic bonding in which the whole structure is not heated but a portion thereof is heated and pressurized, and the same degrees of heat and pressure are applied thereto, the flexible substrate is likely to be partially softened and easily deformed. For example, ultrasonic bonding makes the flexible substrate likely to be partially softened and easily deformed due to frictional heat.

In the case of using ultrasonic bonding, ultrasonic vibrations disperse due to the flexibility of the flexible substrate, and it is difficult to obtain a sufficient bonding strength. This makes a bonding failure easy to occur. In particular, in the case where a cavity is formed in an area of the flexible substrate in which an electronic component is to be mounted for the functional reason of a component-mounting resin substrate, the ultrasonic vibrations are more likely to disperse. For this reason, the bonding failure is more likely to occur, and reliability is reduced.

SUMMARY OF THE INVENTION

Preferred embodiments of the present invention provide resin substrates that securely bond electronic components even when the resin substrates include a thermoplastic material and a cavity, and also provide component-mounting resin substrates including the resin substrates and the electronic components.

A preferred embodiment of the present invention relates to a resin substrate that includes a resin body including a mounting area in which a component is to be mounted by hot pressing and that includes the following features. The resin substrate includes a thermoplastic resin body, a cavity, and a plating layer. The cavity is defined in the mounting area of the resin body and hollowed from a mounting surface. The plating layer is disposed on at least a portion of a wall surface of the cavity and includes a material harder than the resin body.

With the above structure, the plating layer increases the stiffness of the cavity, the resin body is prevented from being deformed when the component is bonded to the resin body, and ultrasonic waves are prevented from dispersing due to the cavity during hot pressing.

A resin substrate according to a preferred embodiment of the present invention preferably includes the following structure. The resin body includes thermoplastic resin layers that are stacked. The resin body includes conductor patterns extending in a direction perpendicular or substantially perpendicular to a stacking direction. The conductor patterns are physically connected to the plating layer.

With the above structure, the conductor patterns in the resin substrate significantly reduce the above factors of the bonding failure.

A resin substrate according to a preferred embodiment of the present invention may include the following structure. The conductor patterns are disposed at different positions in the stacking direction. The conductor patterns disposed at the different positions in the stacking direction are electrically connected to each other by the plating layer.

With the above structure, the plating layer provides the cavity with a physical feature which can also be used as an interlayer connection conductor.

A resin substrate according to a preferred embodiment of the present invention may include the following structure. The conductor patterns are disposed at the same or substantially the same position in the stacking direction. The conductor patterns disposed at the same or substantially the same position in the stacking direction overlap mounting land conductors of the component in a plan view of the resin body.

With the above structure, the stiffness of portions including the mounting land conductors of the component during bonding is able to be increased.

A resin substrate according to a preferred embodiment of the present invention preferably includes the following structure. The resin body includes areas with different thicknesses. The cavity is defined in the area with a large thickness. The component is mounted above such area.

With the above structure, the resin substrate includes a portion that is likely to be deformed and a portion that is unlikely to be deformed, and the component is mounted on the portion that is unlikely to be deformed. Accordingly, a bonding failure is more unlikely to occur when the component is mounted on the resin substrate, and the resin substrate is able to include the portion that is likely to be deformed (bent).

Preferred embodiments of the present invention also relate to a component-mounting resin substrate that includes a resin substrate and a component mounted on the resin substrate and that includes the following features.

The resin substrate includes a thermoplastic resin body, a cavity, and a plating layer. The cavity is defined in a mounting area of the resin body in which the component is mounted, and is hollowed from a mounting surface on which the component is mounted. The plating layer is disposed on at least a portion of a wall surface of the cavity and includes a material harder than the resin body. The component is mounted on the resin substrate with an ultrasonically-bonded portion interposed therebetween.

With the above structure, the plating layer increases the stiffness of the cavity, the resin body is prevented from being deformed when the component is bonded to the resin body, and ultrasonic waves are prevented from dispersing due to the cavity.

Preferred embodiments of the present invention also relate to a method of manufacturing a component-mounting resin substrate, and the method includes the following features. The manufacturing method includes forming a resin body in which thermoplastic resin layers are stacked. The manufacturing method includes forming a cavity in the resin body. The manufacturing method includes forming a plating layer covered by a material harder than the resin body on at least a portion of a wall surface of the cavity. The manufacturing method includes bonding a component to the resin body by hot pressing, and the component overlaps the cavity in a plan view of the resin body.

In the manufacturing method, the cavity is reinforced with the plating layer. Accordingly, the cavity is unlikely to be deformed even when the component is bonded by ultrasonic bonding during hot pressing after the cavity is formed, ultrasonic waves are unlikely to disperse due to the cavity, and the component is able to be securely mounted on the resin substrate.

According to the preferred embodiments of the present invention, a component is able to be securely bonded to a resin substrate even in the case where a thermoplastic material is included and a cavity is provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described in detail with reference to the drawings. Note that, each preferred embodiment described below indicates one specific example of the present invention. Numerical values, shapes, materials, elements, arrangement positions and connection forms of the elements, steps, orders of the steps, or the like indicated in the following preferred embodiments are each one example, the present invention is not intended to be limited thereto. Additionally, elements which are not described in independent claims indicating the highest concept of the present invention among the elements of the preferred embodiments described below are described as arbitrary elements.

Figure 1:
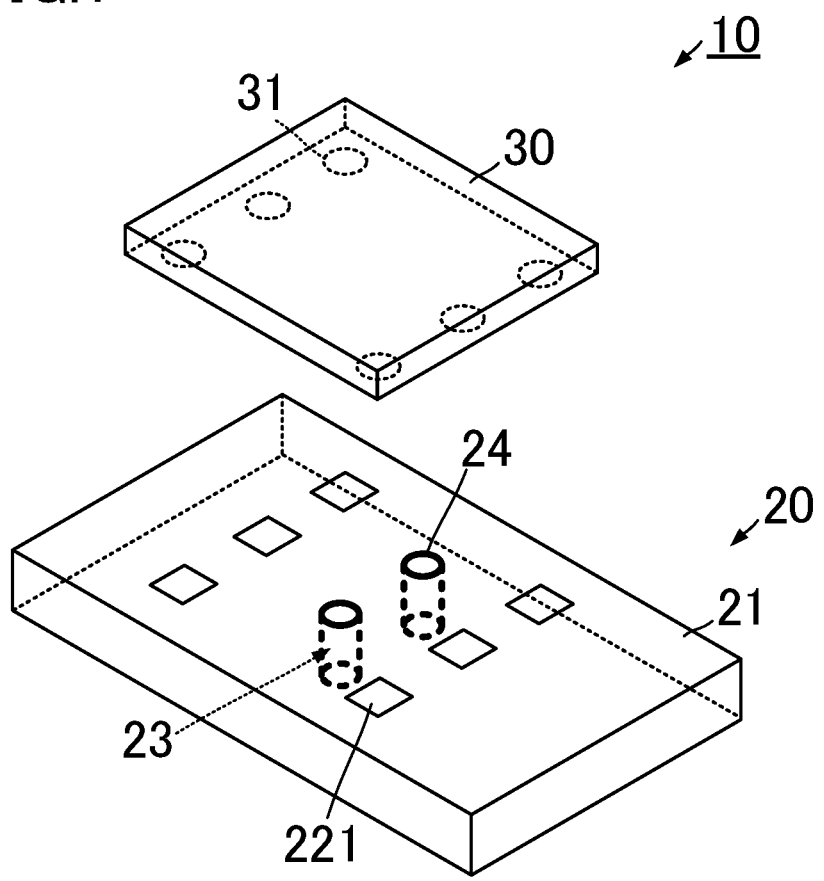
FIG. 1 is an exploded perspective view of a component-mounting resin substrate according to a first preferred embodiment of the present invention.
Figure 2:
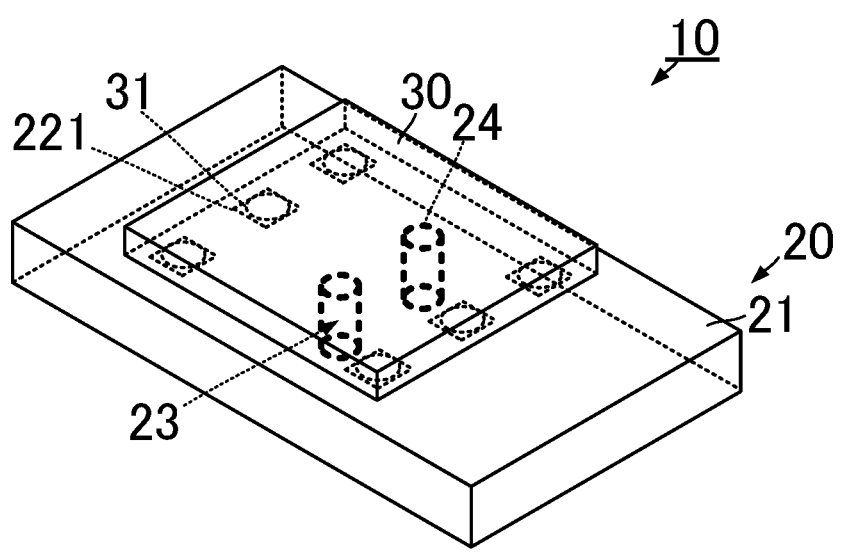
FIG. 2 is a perspective view of the component-mounting resin substrate according to the first preferred embodiment of the present invention.
Figure 3:
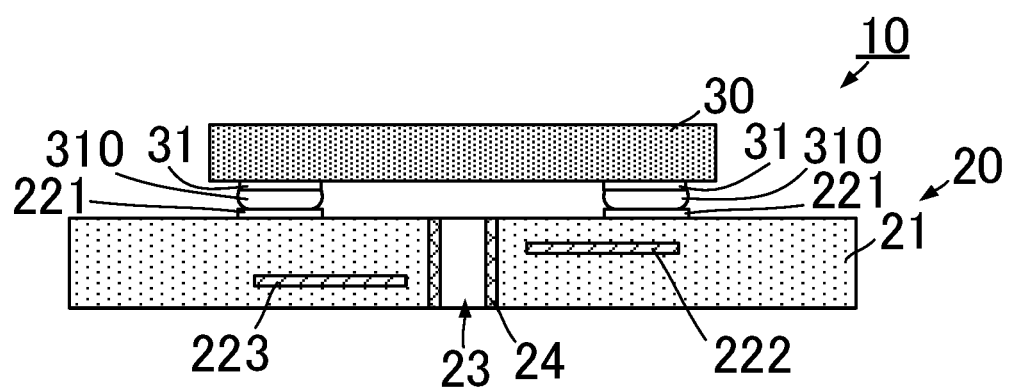
FIG. 3 is a sectional view of the structure of the component-mounting resin substrate according to the first preferred embodiment of the present invention.

A resin substrate, a component-mounting resin substrate, and a method of manufacturing the component-mounting resin substrate according to the first preferred embodiment of the present invention will be described with reference to the drawings. FIG. 1 is an exploded perspective view of the component-mounting resin substrate according to the first preferred embodiment. FIG. 2 is a perspective view of the component-mounting resin substrate according to the first preferred embodiment. FIG. 3 is a sectional view of the structure of the component-mounting resin substrate according to the first preferred embodiment. FIG. 4A, FIG. 4B, FIG. 5A, and FIG. 5B illustrate perspective views of the structure of the resin substrate in manufacturing processes according to the first preferred embodiment. FIG. 6 is a flowchart of the method of manufacturing the component-mounting resin substrate according to the first preferred embodiment.

As illustrated in FIG. 1, a component-mounting resin substrate 10 includes a resin substrate 20 and a component 30. The resin substrate 20 includes a resin body 21, mounting land conductors 221, inner-layer conductor patterns 222 and 223, cavities 23 defined in the resin body 21, and plating layers 24.

The resin body 21 includes a thermoplastic material. The main material of the resin body 21 is, for example, a liquid-crystal polymer.

The mounting land conductors 221 are provided on a front surface (mounting surface) of the resin body 21. The mounting land conductors 221 are rectangular or substantially rectangular conductor patterns. The mounting land conductors 221 are provided in a pattern in accordance with a pattern of terminal conductors 31 of the component 30 to be mounted on the resin body 21.

The resin body 21 includes the cavities 23 extending from the front surface to a back surface. The cavities 23 are defined within an area surrounded by the mounting land conductors 221 in a plan view of the resin body 21, that is, an area (corresponds to a "mounting area" according to the present invention) covered by the component 30 in a state where the component 30 is mounted on the resin substrate 20 (resin body 21). Each of the cavities 23 provides a physical feature, for example, an optical path, a ventilation path, or a heat-radiation path, and providing a connection is not the main feature thereof.

The plating layers 24 are provided on wall surfaces of the cavities 23. Each of the plating layers 24 includes a material harder than the resin body 21 including the thermoplastic material. The plating layers 24 are formed by, for example, metal plating. It is only necessary for each of the plating layers 24 to be provided on at least a portion of the wall surface of the corresponding cavity 23. Each of the plating layers 24, however, is preferably provided on the entire wall surface of the corresponding cavity 23.

The component 30 includes, for example, a semiconductor chip and includes the terminal conductors 31 on a surface of a housing. Solder bumps 310, for example, are provided on the terminal conductors 31.

As illustrated in FIG. 2 and FIG. 3, the component 30 is mounted on the resin substrate 20 in a state where the terminal conductors 31 are bonded to the mounting land conductors 221 with the solder bumps 310 interposed therebetween. The component 30 is mounted on the resin substrate 20 by ultrasonic bonding.

The resin body 21 defined the resin substrate 20 is thermoplastic. Accordingly, the resin body 21 is softened due to frictional heat when the component 30 is mounted on the resin substrate 20 by ultrasonic bonding. The thermoplastic properties that facilitate the occurrence of an adverse effect on bonding, for example, ultrasonic vibrations being likely to disperse, as described above as an existing problem. In particular, in the case where there is a cavity that is not plated, the resin body 21 is more likely to be deformed, which facilitates the occurrence of an adverse effect on bonding, for example, ultrasonic vibrations being more likely to disperse.

However, in the resin substrate 20 according to the present preferred embodiment, the plating layers 24 are provided on the cavities 23 defined in the resin body 21, and accordingly, even when the resin body 21 is heated and vibrated due to ultrasonic bonding, the plating layers 24 provided on the cavities 23 define and function as reinforcements, and the resin body 21 is unlikely to be deformed. In addition, the plating layers 24 inhibit the ultrasonic vibrations from dispersing due to the cavities 23. Accordingly, the occurrence of a bonding failure is able to be significantly reduced when the component 30 is mounted on the resin substrate 20.

The component-mounting resin substrate 10 including the above structure is manufactured by processes illustrated in FIG. 6 through structural stages illustrated in FIG. 4A, FIG. 4B, FIG. 5A, and FIG. 5B.

Figure 4A:
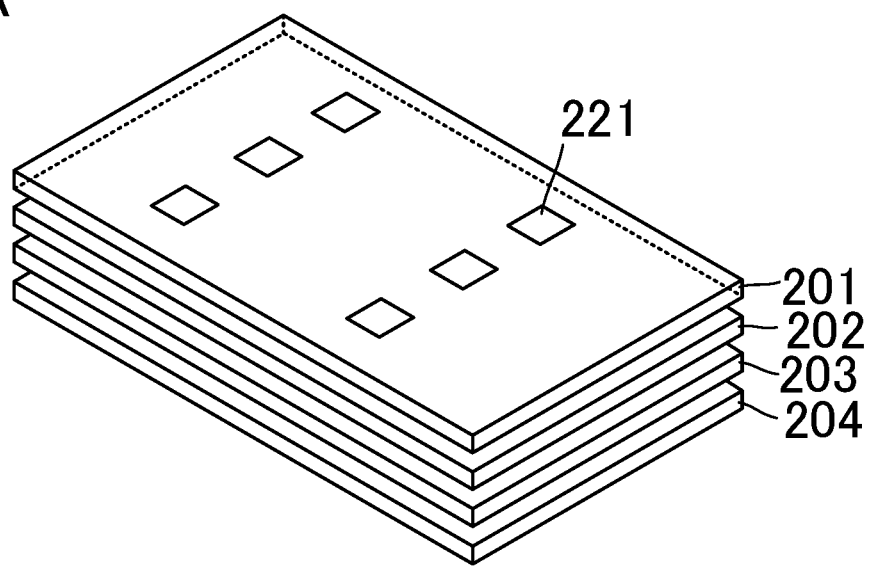
FIG. 4A is a perspective view of the structure of the resin substrate in a manufacturing process according to the first preferred embodiment of the present invention.

As illustrated in FIG. 4A, thermoplastic resin films (corresponding to "resin layers") 201, 202, 203, and 204 are first prepared, and conductor patterns are formed at predetermined positions (S101). For example, the mounting land conductors 221 are formed on the front surface of the thermoplastic resin film 201. According to the present preferred embodiment, four layers of the thermoplastic resin films define the resin substrate 20, for example. However, the number of the layers may not be four.

Figure 4B:
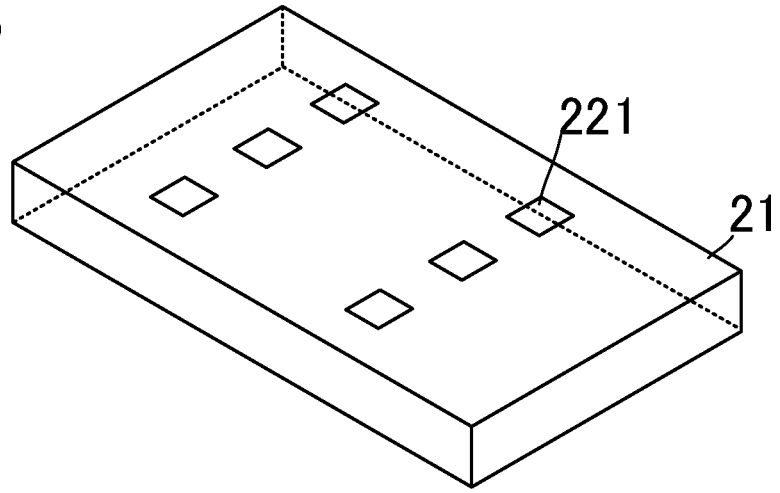
FIG. 4B is a perspective view of the structure of the resin substrate in a manufacturing process according to the first preferred embodiment of the present invention.

Subsequently, as illustrated in FIG. 4B, the thermoplastic resin films 201, 202, 203, and 204 are stacked and subjected to hot pressing to form the resin body 21 in which the conductor patterns are located at the predetermined positions (S102).

Figure 5A:
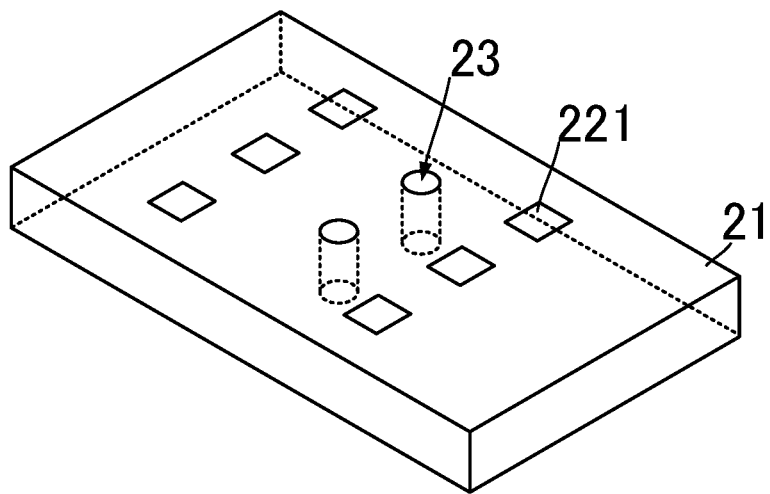
FIG. 5A is a perspective view of the structure of the resin substrate in a manufacturing process according to the first preferred embodiment of the present invention.
Figure 6:
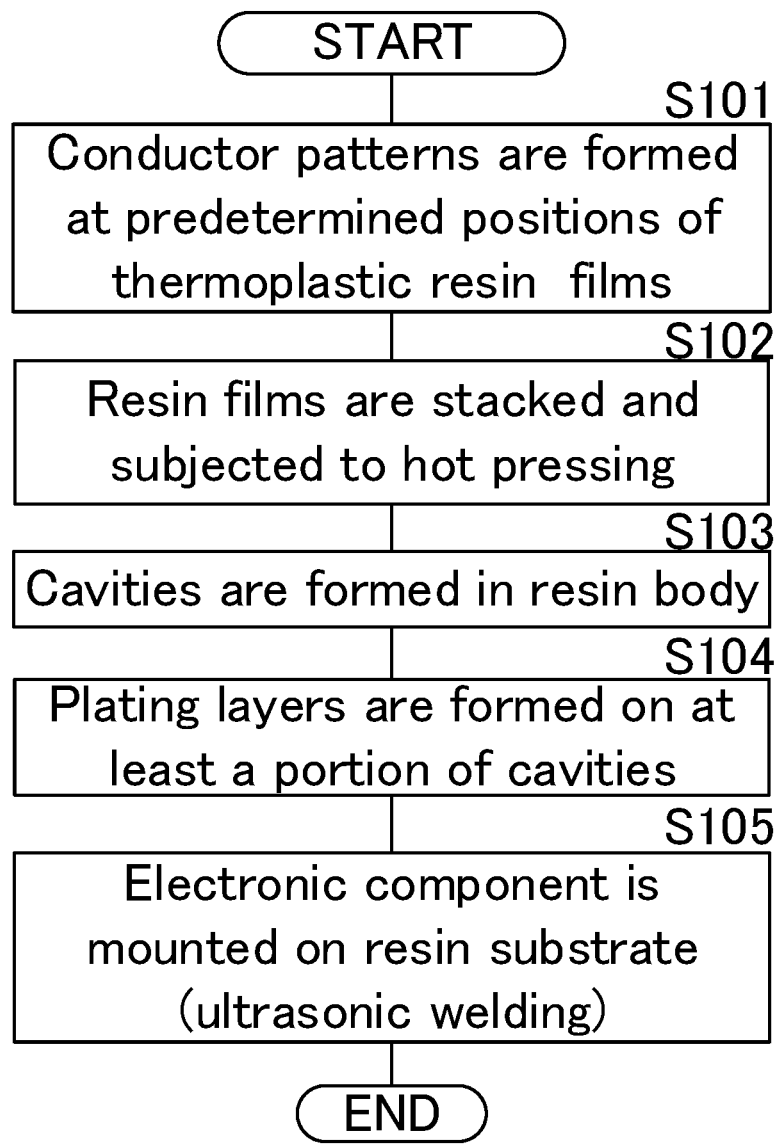
FIG. 6 is a flowchart of a method of manufacturing the component-mounting resin substrate according to the first preferred embodiment of the present invention.

Subsequently, as illustrated in FIG. 5A, the cavities 23 extending from the front surface to the back surface of the resin body 21 are formed (S103). The cavities 23 are formed, for example, by irradiating the resin body 21 with a laser beam.

Figure 5B:
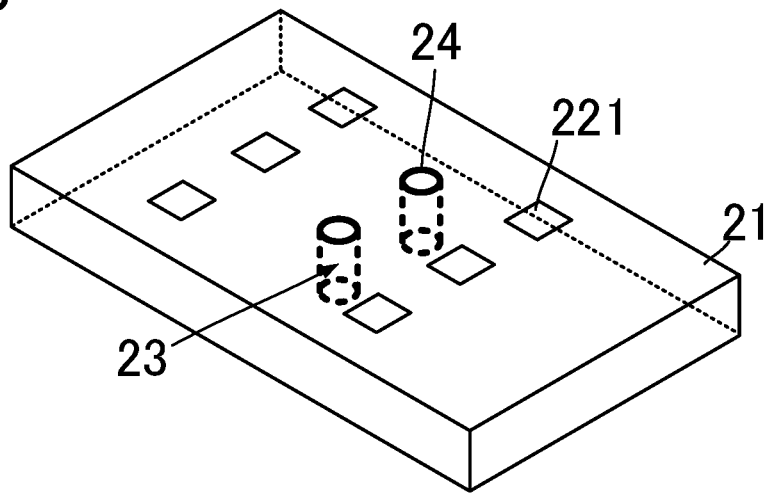
FIG. 5B is a perspective view of the structure of the resin substrate in a manufacturing process according to the first preferred embodiment of the present invention.

Subsequently, as illustrated in FIG. 5B, each of the plating layers 24 is formed on at least a portion of the wall surface of the corresponding cavity 23 (S104). The plating layers 24 are formed by one of various plating methods, for example, an electroless plating method or an electroplating method.

Subsequently, the component 30 is mounted on the resin substrate 20. At this time, the component 30 is mounted on the resin substrate 20 by ultrasonic bonding (ultrasonic welding) (S105).

The manufacturing method described above significantly reduces or prevents the occurrence of a bonding failure between the component 30 and the resin substrate 20 due to the cavities 23 during ultrasonic bonding in a state where the cavities 23 are formed in portions to be covered by the component 30.

Figure 7:
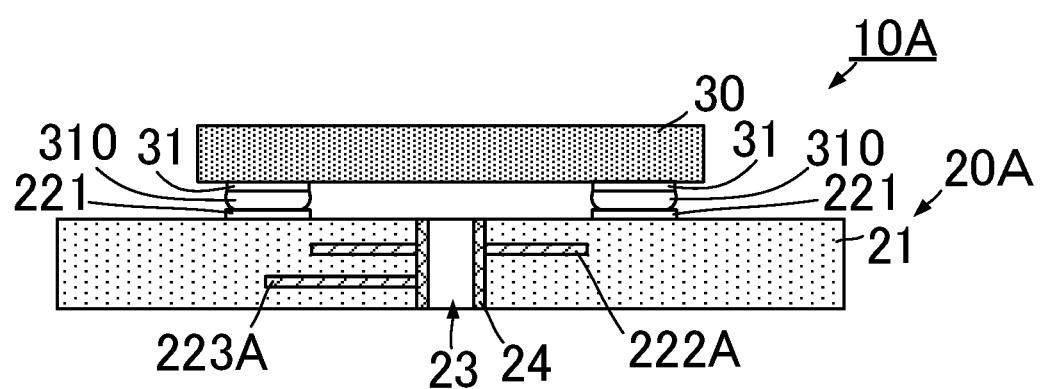
FIG. 7 is a sectional view of the structure of a component-mounting resin substrate according to a second preferred embodiment of the present invention.

A resin substrate and a component-mounting resin substrate according to a second preferred embodiment of the present invention will now be described with reference to the drawings. FIG. 7 is a sectional view of the structure of the component-mounting resin substrate according to the second preferred embodiment.

A component-mounting resin substrate 10A according to the second preferred embodiment differs from the component-mounting resin substrate 10 according to the first preferred embodiment in the structure of a resin substrate 20A. The other structure is the same as or similar to the component-mounting resin substrate 10 according to the first preferred embodiment.

The resin substrate 20A further includes inner-layer conductor patterns 222A and 223A in addition to the components of the resin substrate 20. The inner-layer conductor patterns 222A and 223A extend in the direction perpendicular or substantially perpendicular to the thickness direction (stacking direction of the resin films) of the resin substrate 20A (resin body 21). The inner-layer conductor patterns 222A and 223A are disposed at different positions in the thickness direction of the resin substrate 20A.

The inner-layer conductor patterns 222A and 223A are connected to the plating layers 24. With the above structure, the inner-layer conductor pattern 222A and the inner-layer conductor pattern 223A are electrically connected to each other by the plating layers 24. That is, the plating layers 24 define and function as interlayer connection conductors.

Also with the above structure, the same or similar effects as in the first preferred embodiment are able to be provided.

The direction in which the inner-layer conductor patterns 222A and 223A extend is perpendicular or substantially perpendicular to the direction in which the plating layers 24 extend. Accordingly, the inner-layer conductor patterns 222A and 223A define and function as anchor members when the plating layers are secured to the resin body 21. The above features significantly reduce effects of softening of the resin body 21 and the presence of the cavities 23 during ultrasonic bonding, and further significantly reduce or prevent the occurrence of a bonding failure between the component 30 and the resin substrate 20A.

Figure 8:
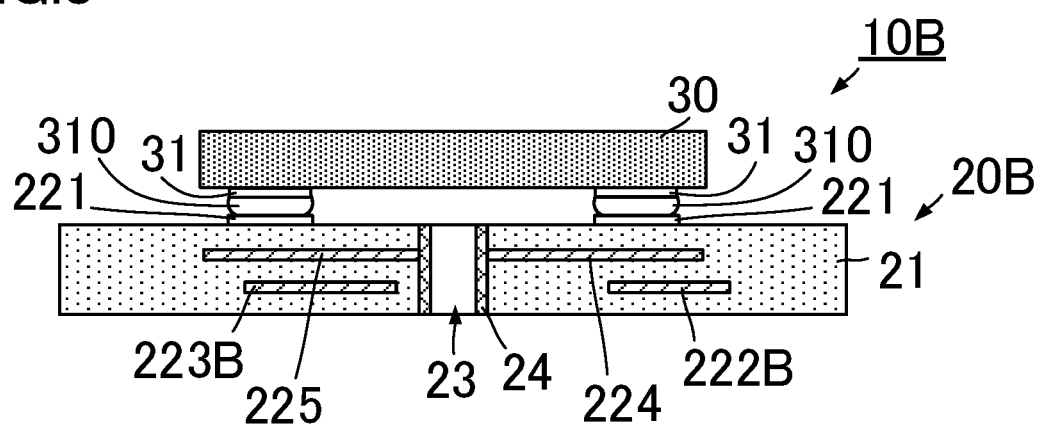
FIG. 8 is a sectional view of the structure of a component-mounting resin substrate according to a third preferred embodiment of the present invention.

A resin substrate and a component-mounting resin substrate according to a third preferred embodiment of the present invention will now be described with reference to the drawings. FIG. 8 is a sectional view of the structure of the component-mounting resin substrate according to the third preferred embodiment.

A component-mounting resin substrate 10B according to the third preferred embodiment differs from the component-mounting resin substrate 10 according to the first preferred embodiment in the structure of a resin substrate 20B. The other structure is the same as or similar to the component-mounting resin substrate 10 according to the first preferred embodiment.

The resin substrate 20B further includes inner-layer conductor patterns 222B, 223B, and 224 in addition to the components of the resin substrate 20. The inner-layer conductor patterns 222B, 223B, and 224 extend in the direction perpendicular or substantially perpendicular to the thickness direction (stacking direction of the resin films) of the resin substrate 20B (resin body 21).

The inner-layer conductor pattern 224 is physically connected to the plating layers 24. The inner-layer conductor pattern 224 overlaps one of the mounting land conductors 221 in a plan view of the resin substrate 20B (resin body 21).

With the above structure, the inner-layer conductor pattern 224 defines and functions as an anchor member when the plating layers 24 are secured to the resin body 21. These features further increase the stiffness of the cavities 23. The inner-layer conductor pattern 224 defines and functions as a base in the mounting area in which the component 30 is mounted, and accordingly, the resin body 21 is able to be prevented from being deformed in the mounting area. Accordingly, the occurrence of a bonding failure between the component 30 and the resin substrate 20B is able to be further significantly reduced or prevented.

The distance between the inner-layer conductor pattern 224 and the front surface (mounting surface) of the resin substrate 20B is preferably shorter than the distance between the inner-layer conductor pattern 224 and the back surface of the resin substrate 20B. As the distance between the inner-layer conductor pattern 224 and the front surface decreases, the occurrence of a bonding failure is able to be further significantly reduced or prevented.

Figure 9:
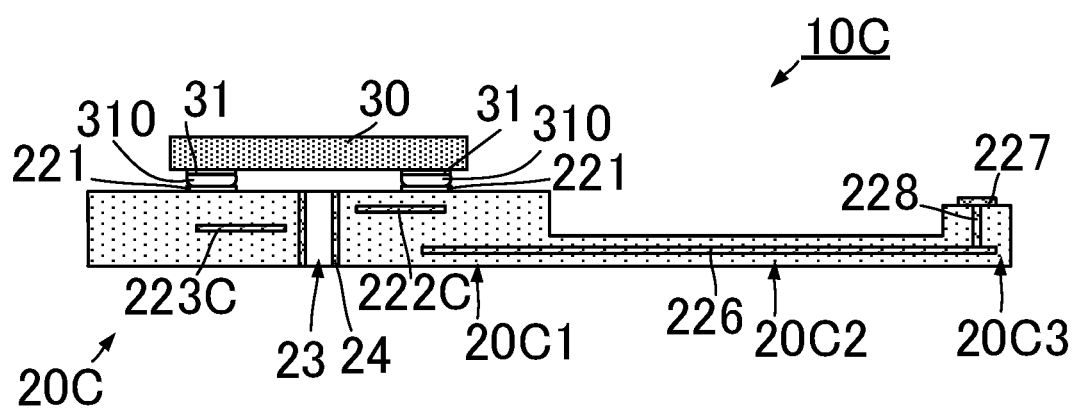
FIG. 9 is a sectional view of the structure of a component-mounting resin substrate according to a fourth preferred embodiment of the present invention.

A resin substrate and a component-mounting resin substrate according to a fourth preferred embodiment of the present invention will now be described with reference to the drawings. FIG. 9 is a sectional view of the structure of the component-mounting resin substrate according to the fourth preferred embodiment.

A component-mounting resin substrate 10C according to the fourth preferred embodiment differs from the component-mounting resin substrate 10 according to the first preferred embodiment in the structure of a resin substrate 20C. The other structure is the same as or similar to the component-mounting resin substrate 10 according to the first preferred embodiment.

The resin substrate 20C includes a component-mounting portion 20C1, a wiring portion 20C2, and an external connection terminal portion 20C3. The component-mounting portion 20C1 is connected to the external connection terminal portion 20C3 with the wiring portion 20C2 interposed therebetween. The component-mounting portion 20C1, the wiring portion 20C2, and the external connection terminal portion 20C3 are integrally formed. The thickness of the resin body of the component-mounting portion 20C1 is larger than the thickness of the resin body of the wiring portion 20C2. The thickness of the resin body of the external connection terminal portion 20C3 is larger than the thickness of the resin body of the wiring portion 20C2. The thickness of the resin body of the external connection terminal portion 20C3 may be equal or substantially equal to the thickness of the resin body of the wiring portion 20C2.

The mounting land conductors 221 are located on the front surface of the component-mounting portion 20C1. The cavities 23 extending from the front surface to the back surface are provided in the resin body of the component-mounting portion 20C1. The plating layers 24 are provided on the wall surfaces of the cavities 23. That is, the component-mounting portion 20C1 includes the same or similar structure as the resin substrates according to the above preferred embodiments. Inner-layer conductor patterns 222C and 223C and a portion of a wiring conductor pattern 226 on one side in the direction in which the wiring conductor pattern 226 extends are provided in the component-mounting portion 20C1. The component 30 is mounted on the component-mounting portion 20C1 with the terminal conductors 31 bonded to the mounting land conductors 221.

A central portion of the wiring conductor pattern 226 in the direction in which the wiring conductor pattern 226 extends is included in the wiring portion 20C2. The other portion of the wiring conductor pattern 226 on the other side in the direction in which the wiring conductor pattern 226 extends is included in the external connection terminal portion 20C3. An external connection terminal 227 is provided on the front surface of the external connection terminal portion 20C3. The external connection terminal portion 20C3 is connected to the wiring conductor pattern 226 by an interlayer connection conductor 228.

With the above structure, a routing conductor pattern (not illustrated) for the component 30 and a circuit provided on the component-mounting portion 20C1 is connected to the external connection terminal portion 20C3 by the wiring conductor pattern 226, and is connected to the external connection terminal 227 in the external connection terminal portion 20C3 with the interlayer connection conductor 228 interposed therebetween.

With the above structure, the component 30 is mounted on the component-mounting portion 20C1, which includes a large thickness and is unlikely to be deformed. Accordingly, the occurrence of a bonding failure when the component 30 is bonded to the resin substrate 20C is able to be further significantly reduced or prevented. In the component-mounting resin substrate 100, the wiring portion 20C2 is likely to be deformed, and accordingly, the wiring portion 20C2 that is deformed is able to be disposed on another component. Accordingly, various arrangements are able to be provided, and the component 30 is able to be prevented from being separated to significantly improve the reliability.

In the preferred embodiments described above, the solder bumps and the conductor patterns (for example, electrodes) define the ultrasonically-bonded portions. However, the above structure is able to be provided in the case where the conductor patterns define the ultrasonically-bonded portions.

Figure 10:
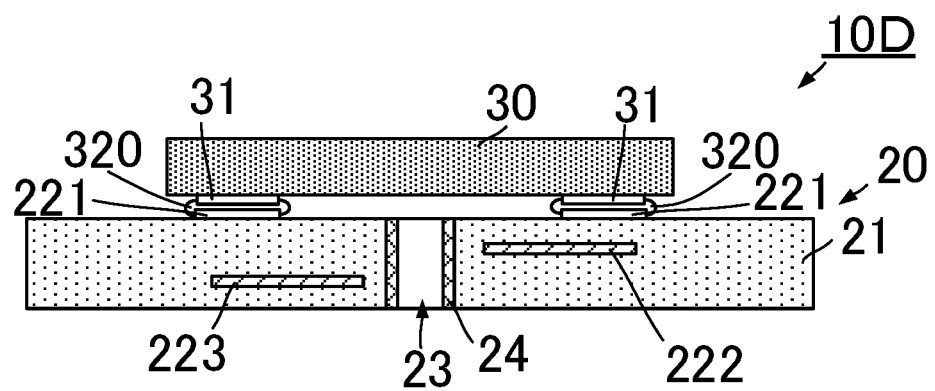
FIG. 10 is a sectional view of another bonding structure according to a fifth preferred embodiment of the present invention.

As illustrated in FIG. 10, the terminal conductors and the mounting land conductors may be bonded to each other by anisotropic conductive films. FIG. 10 is a sectional view of another bonding structure according to a fifth preferred embodiment of the present invention.

A component-mounting resin substrate 10D illustrated in FIG. 10 differs from the component-mounting resin substrate 10 according to the first preferred embodiment in that the solder bumps 310 are changed into anisotropic conductive films 320. The other structure of the component-mounting resin substrate 10D is the same as or similar to the component-mounting resin substrate 10, and a description of the same or similar structure is omitted.

As illustrated in FIG. 10, the terminal conductors 31 of the component 30 and the mounting land conductors 221 of the resin substrate 20 are bonded to each other by the anisotropic conductive films 320. In a specific manufacturing method, the anisotropic conductive films 320 cover the terminal conductors 31 or the mounting land conductors 221. The component 30 is disposed on the resin substrate 20, and the anisotropic conductive films 320 are in contact with the terminal conductors 31 and the mounting land conductors 221. In this state, the anisotropic conductive films 320 are subjected to hot pressing to join the terminal conductors 31 and the mounting land conductors 221 to each other, that is, to join the component 30 and the resin substrate 20 to each other.

The case of including the anisotropic conductive films as described above also provides the effects of the above preferred embodiments. The anisotropic conductive films are able to be included for the second preferred embodiment, the third preferred embodiment, and the fourth preferred embodiment.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A resin substrate comprising:
   a thermoplastic resin body including a mounting area in which a component is to be mounted by hot pressing;
   a cavity defined in the mounting area of the resin body and extending from a front surface to a back surface of the resin body; and
   a plating layer disposed on a wall surface of the cavity and including a material harder than the resin body; wherein
   a space in the cavity connecting the front surface and the back surface is defined by the plating layer disposed on the wall surface of the cavity;
   the resin body includes thermoplastic resin layers that are stacked in a stacking direction;
   the resin body includes conductor patterns extending in a direction perpendicular or substantially perpendicular to the stacking direction; and
   the conductor patterns are physically connected to the plating layer.

2. The resin substrate according to claim 1, wherein
   the conductor patterns are disposed at different positions in the stacking direction; and
   the conductor patterns disposed at the different positions in the stacking direction are electrically connected to each other by the plating layer.

3. The resin substrate according to claim 2, wherein the resin body includes areas with different thicknesses, the cavity is defined in one of the areas with a larger thickness than others of the areas, and the component is mounted above the one of the areas.

4. The resin substrate according to claim 1, wherein the conductor patterns are disposed at a same or a substantially same position in the stacking direction, and the conductor patterns disposed at the same or the substantially same position in the stacking direction overlap mounting land conductors of the component in a plan view of the resin body.

5. The resin substrate according to claim 4, wherein the resin body includes areas with different thicknesses, the cavity is defined in one of the areas with a larger thickness than others of the areas, and the component is mounted above the one of the areas.

6. The resin substrate according to claim 1, wherein the resin body includes areas with different thicknesses, the cavity is defined in one of the areas with a larger thickness than others of the areas, and the component is mounted above the one of the areas.

7. The resin substrate according to claim 1, wherein
   at least one of the conductor patterns defines and functions as an anchor pattern that secures the plating layer to the resin body; and
   a distance between the anchor pattern and the front surface of the resin body is shorter than a distance between the anchor pattern and the back surface of the resin body.

8. The resin substrate according to claim 1, wherein the resin body includes areas with different thicknesses, the cavity is defined in one of the areas with a larger thickness than others of the areas, and the component is mounted above the one of the areas.

9. The resin substrate according to claim 1, wherein
   a plurality of mounting land conductors are provided in a predetermined pattern on the front surface of the resin body; and
   the predetermined pattern of the plurality of mounting land conductors corresponds to a pattern of a plurality of terminal conductors of the component.

10. The resin substrate according to claim 1, wherein the cavity is one of a plurality of cavities that are defined in the mounting area of the resin body.

11. The resin substrate according to claim 1, wherein the cavity defines at least one of an optical path, a ventilation path, and a heat-radiation path in the resin body.

12. The resin substrate according to claim 1, wherein the plating layer includes a metal plating material.

13. The resin substrate according to claim 1, wherein the plating layer is provided over an entire portion of the wall surface of the cavity.

14. The resin substrate according to claim 1, wherein a main material of the resin body is a liquid-crystal polymer.

15. The resin substrate according to claim 1, wherein the component is a semiconductor chip.

* * * * *